United States Patent
Araki et al.

(10) Patent No.: US 8,647,904 B2
(45) Date of Patent: Feb. 11, 2014

(54) METHOD FOR MANUFACTURING NITRIDE SEMICONDUCTOR DEVICE, NITRIDE SEMICONDUCTOR LIGHT-EMITTING DEVICE, AND LIGHT-EMITTING APPARATUS

(75) Inventors: Masahiro Araki, Osaka (JP); Takaaki Utsumi, Osaka (JP); Masahiko Sakata, Osaka (JP)

(73) Assignee: Sharp Kabushiki Kaisha, Osaka-shi (JP)

(*) Notice: Subject to any disclaimer, the term of this patent is extended or adjusted under 35 U.S.C. 154(b) by 0 days.

(21) Appl. No.: 13/580,330

(22) PCT Filed: Feb. 23, 2011

(86) PCT No.: PCT/JP2011/054008
§ 371 (c)(1),
(2), (4) Date: Aug. 21, 2012

(87) PCT Pub. No.: WO2011/108422
PCT Pub. Date: Sep. 9, 2011

(65) Prior Publication Data
US 2012/0319162 A1    Dec. 20, 2012

(30) Foreign Application Priority Data
Mar. 1, 2010 (JP) .................... 2010-044343

(51) Int. Cl.
*H01L 21/00*    (2006.01)
(52) U.S. Cl.
USPC ............... 438/46; 257/E21.001; 257/E21.09; 257/E21.097; 257/E21.117; 257/E21.118; 257/E21.121; 257/E21.126; 438/22; 438/479; 438/492; 438/503
(58) Field of Classification Search
USPC ............... 257/E21.001, E21.09, E21.097, 257/E21.117, E21.118, E21.121, E21.126; 438/22, 46, 479, 492, 503
See application file for complete search history.

(56) References Cited

U.S. PATENT DOCUMENTS

| | | | |
|---|---|---|---|
| 5,122,845 A | 6/1992 | Manabe et al. | |
| 6,713,789 B1 | 3/2004 | Shibata et al. | |
| 2002/0113248 A1 | 8/2002 | Yamagata et al. | |
| 2005/0040481 A1 | 2/2005 | Shimizu et al. | |
| 2009/0026481 A1* | 1/2009 | Kamikawa et al. | ............. 257/98 |
| 2010/0219445 A1* | 9/2010 | Yokoyama et al. | ........... 257/101 |

FOREIGN PATENT DOCUMENTS

| | | |
|---|---|---|
| JP | 5-86646 | 12/1993 |
| JP | 3026087 | 1/2000 |
| JP | 2001-217503 | 8/2001 |
| JP | 2002-9004 | 1/2002 |
| JP | 2002-334790 | 11/2002 |
| JP | 3440873 | 6/2003 |
| JP | 3700492 | 7/2005 |
| JP | 2006-4970 | 1/2006 |
| JP | 2007-19504 | 1/2007 |
| JP | 2008-297138 | 12/2008 |
| JP | 2009-81406 | 4/2009 |
| JP | 2010-40867 | 2/2010 |

OTHER PUBLICATIONS

Search Report mailed Mar. 22, 2011, directed International Application No. PCT/JP2011/054008; 4 pages.

* cited by examiner

*Primary Examiner* — Asok K Sarkar
(74) *Attorney, Agent, or Firm* — Morrison & Foerster LLP

(57) ABSTRACT

Provided is a method for manufacturing a nitride semiconductor device, including the steps of: forming an AlNO buffer layer containing at least aluminum, nitrogen, and oxygen on a substrate; and forming a nitride semiconductor layer on the AlNO buffer layer, wherein, in the step of forming the AlNO buffer layer, the AlNO buffer layer is formed by a reactive sputtering method using aluminum as a target in an atmosphere to and from which nitrogen gas and oxygen gas are continuously introduced and exhausted, and the atmosphere is an atmosphere in which a ratio of a flow rate of the oxygen gas to a sum of a flow rate of the nitrogen gas and the flow rate of the oxygen gas is not more than 0.5%.

16 Claims, 6 Drawing Sheets

METHOD FOR MANUFACTURING NITRIDE SEMICONDUCTOR DEVICE, NITRIDE SEMICONDUCTOR LIGHT-EMITTING DEVICE, AND LIGHT-EMITTING APPARATUS

REFERENCE TO RELATED APPLICATIONS

This application is a national stage application under 35 USC 371 of International Application No. PCT/JP2011/054008, filed Feb. 23, 2011, which claims priority from Japanese Patent Application No. 2010-044343 filed Mar. 1, 2010, the entire contents of which are incorporated herein by reference.

FIELD OF THE INVENTION

The present invention relates to a method for manufacturing a nitride semiconductor device, a nitride semiconductor light-emitting device, and a light-emitting apparatus.

BACKGROUND OF THE INVENTION

A group III-V compound semiconductor containing nitrogen (group III nitride semiconductor) has a bandgap corresponding to the energy of light having a wavelength in the infrared to ultraviolet region, and thus is useful as a material for a light-emitting device which emits light having a wavelength in the infrared to ultraviolet region and a light-receiving device which receives light having a wavelength in that region.

In addition, the group III nitride semiconductor has strong binding between atoms which constitute the group III nitride semiconductor, high breakdown voltage, and high saturation electron speed. Therefore, the group III nitride semiconductor is also useful as a material for an electronic device such as a high-temperature-resistant, high-power, and high-frequency transistor.

Furthermore, the group III nitride semiconductor is also attracting attention as a material which hardly damages the environment and is easy to handle.

In order to fabricate a practical nitride semiconductor device using the group III nitride semiconductor which is an excellent material as described above, it is necessary to stack a group III nitride semiconductor layer made of a thin film of the group III nitride semiconductor on a predetermined substrate to form a predetermined device structure.

As the substrate, it is most suitable to use a substrate made of a group III nitride semiconductor having a lattice constant and a thermal expansion coefficient which allow the group III nitride semiconductor to grow directly on the substrate. For example, a gallium nitride (GaN) substrate or the like is preferably used as the substrate made of the group III nitride semiconductor.

At present, however, the GaN substrate has small dimensions, that is, has a diameter of two inches or less, and is very expensive. Therefore, the GaN substrate is not practical.

For this reason, at present, a sapphire substrate, a silicon carbide (SiC) substrate, or the like having a large difference in lattice constant and thermal expansion coefficient from the group III nitride semiconductor is used as a substrate for fabricating a nitride semiconductor device.

There exists a difference in lattice constant of about 16% between the sapphire substrate and GaN, which is a typical group III nitride semiconductor. In addition, there exists a difference in lattice constant of about 6% between the SiC substrate and GaN. When such a large difference in lattice constant exists between the substrate and the group III nitride semiconductor which grows thereon, it is generally difficult to epitaxially grow a crystal made of the group III nitride semiconductor on the substrate. For example, when a GaN crystal is epitaxially grown directly on the sapphire substrate, there is a problem that three-dimensional growth of the GaN crystal cannot be avoided and a GaN crystal having a flat surface cannot be obtained.

Thus, a layer referred to as a so-called buffer layer for eliminating the difference in lattice constant between the substrate and the group III nitride semiconductor is generally formed between the substrate and the group III nitride semiconductor.

For example, Patent Literature 1 (Japanese Patent No. 3026087) describes a method for forming a buffer layer of aluminum nitride (AlN) on a sapphire substrate by a Metal-Organic Vapor Phase Epitaxy (MOVPE) method, and thereafter growing a group III nitride semiconductor made of $Al_xGa_{1-x}N$.

However, also with the method described in Patent Literature 1, it has been difficult to obtain a buffer layer of AlN having a flat surface, with good reproducibility. This is considered to be because, when the buffer layer of AlN is formed by the MOVPE method, trimethyl aluminum (TMA) gas and ammonia ($NH_3$) gas used as source gases easily react in a vapor phase.

Accordingly, in the method described in Patent Literature 1, it has been difficult to grow a high-quality group III nitride semiconductor made of $Al_xGa_{1-x}N$ which has a flat surface and low defect density, on the buffer layer of AlN, with good reproducibility.

In addition, for example, Patent Literature 2 (Japanese Patent Publication No. 5-86646) discloses a method for forming an $Al_xGa_{1-x}N$ ($0<x\leq1$) buffer layer on a sapphire substrate by a high-frequency sputtering method which applies a direct current (DC) bias.

However, a group III nitride semiconductor formed on the $Al_xGa_{1-x}N$ ($0<x\leq1$) buffer layer by the method described in Patent Literature 2 has not had excellent crystallinity, as described in paragraph [0004] of Patent Literature 3 and paragraph [0004] of Patent Literature 4.

Thus, Patent Literature 3 (Japanese Patent No. 3440873) proposes a method for heat-treating a buffer layer made of a group III nitride semiconductor formed by a DC magnetron sputtering method, under an atmosphere of a mixed gas of hydrogen gas and ammonia gas. In addition, Patent Literature 4 (Japanese Patent No. 3700492) proposes a method for forming a buffer layer made of a group III nitride semiconductor having a film thickness of not less than 50 angstroms and not more than 3000 angstroms, on a sapphire substrate having a temperature raised to 400° C. or more, by the DC magnetron sputtering method.

Further, Patent Literature 5 (Japanese Patent Laying-Open No. 2006-4970) discloses a technique for stacking an $Al_2O_3$ layer, an $AlO_xN_y$ layer, and an AlN layer in this order on a sapphire substrate. These three layers are formed by a reactive sputtering method using ECR (Electron Cyclotron Resonance) plasma, and, in order to alleviate a difference in lattice constant between the sapphire substrate and the AlN layer as the uppermost layer of these three layers, the $Al_2O_3$ layer and the $AlO_xN_y$ layer are inserted between the sapphire substrate and the AlN layer (paragraphs [0019] to [0023] of Patent Literature 5). Patent Literature 5 also proposes a method for further forming a buffer layer made of p-type GaN on the AlN layer by the MOVPE method, and forming a nitride semiconductor layer on the buffer layer (paragraph [0024] of Patent Literature 5).

Furthermore, Patent Literature 6 (Japanese Patent Laying-Open No. 2009-81406) discloses a technique for forming a buffer layer on a substrate by the reactive sputtering method, and forming a group III nitride semiconductor layer thereon by the MOVPE method. Patent Literature 6 describes that, preferably, the buffer layer contains oxygen, and the buffer layer has an oxygen concentration of not more than 1 atomic % (paragraph [0028] of Patent Literature 6). Patent Literature 6 describes that, this seems to be because, if the oxygen concentration in the buffer layer is more than 1 atomic %, the buffer layer has too much oxygen, and thus consistency in lattice constant between the substrate and the buffer layer is reduced, and the function as a buffer layer is deteriorated (paragraph [0028] of Patent Literature 6).

Patent Literature 6 also describes that the reason why oxygen is contained in the buffer layer formed by the reactive sputtering method is that an oxygen-containing substance such as moisture sticking to an inner wall of a chamber of a sputtering apparatus is knocked out of the inner wall by sputtering, and oxygen is inevitably mixed into the buffer layer stacked on the substrate (paragraph [0028] of Patent Literature 6).

In addition, in Patent Literature 6, in order to set the oxygen concentration in the buffer layer to not more than 1 atomic %, dummy discharge is repeated 16 times within the chamber before the formation of the buffer layer to reduce a pressure within the chamber such that its internal pressure is reduced to $6 \times 10^{-6}$ Pa, to remove impurities within the chamber.

PTL 1: Japanese Patent No. 3026087
PTL 2: Japanese Patent Publication No. 5-86646
PTL 3: Japanese Patent No. 3440873
PTL 4: Japanese Patent No. 3700492
PTL 5: Japanese Patent Laying-Open No. 2006-4970
PTL 6: Japanese Patent Laying-Open No. 2009-81406

SUMMARY OF THE INVENTION

When a buffer layer mainly made of AlN (hereinafter referred to as an AlN buffer layer) is formed by various sputtering methods described in Patent Literatures 3 to 6, an oxygen-containing substance such as moisture sticking to an inner wall of a chamber of a sputtering apparatus is knocked out of the inner wall by sputtering, and oxygen is inevitably mixed into the AlN buffer layer being formed. Further, since the amount of the oxygen-containing substance remaining in the chamber varies with time, the amount of the oxygen-containing substance knocked out of the inner wall of the chamber during sputtering also varies, and as a result, there has been a problem that the content of oxygen in the buffer layer is not stabilized, that is, crystallinity of the buffer layer has poor reproducibility. When crystallinity of the buffer layer has poor reproducibility, crystallinity of a nitride semiconductor layer formed on the buffer layer also has poor reproducibility.

Furthermore, when dummy discharge is repeated 16 times within the chamber before the formation of the buffer layer as described in Patent Literature 6, a treating time required for the dummy discharge is increased, and thus there has been a problem that the nitride semiconductor layer on the buffer layer and a nitride semiconductor device cannot be efficiently manufactured.

In view of the above circumstances, one object of the present invention is to provide a method for manufacturing a nitride semiconductor device capable of efficiently manufacturing a nitride semiconductor device having excellent characteristics by forming a nitride semiconductor layer having excellent crystallinity with good reproducibility.

The present invention is directed to a method for manufacturing a nitride semiconductor device, including the steps of: forming an AlNO buffer layer containing at least aluminum, nitrogen, and oxygen on a substrate; and forming a nitride semiconductor layer on the AlNO buffer layer, wherein, in the step of forming the AlNO buffer layer, the AlNO buffer layer is formed by a reactive sputtering method using aluminum as a target in an atmosphere to and from which nitrogen gas and oxygen gas are continuously introduced and exhausted, and the atmosphere is an atmosphere in which a ratio of a flow rate of the oxygen gas to a sum of a flow rate of the nitrogen gas and the flow rate of the oxygen gas is not more than 0.5%.

Preferably, in the method for manufacturing a nitride semiconductor device in accordance with the present invention, in the step of forming the AlNO buffer layer, the AlNO buffer layer is formed to have an oxygen concentration of not less than 1 atomic % and not more than 10 atomic %.

Preferably, in the method for manufacturing a nitride semiconductor device in accordance with the present invention, in the step of forming the AlNO buffer layer, the AlNO buffer layer is formed to have a uniform oxygen concentration throughout the AlNO buffer layer.

Preferably, in the method for manufacturing a nitride semiconductor device in accordance with the present invention, in the step of forming the AlNO buffer layer, the AlNO buffer layer is formed to have a refractive index of not less than 2 and not more than 2.1 for light with a wavelength of 450 nm.

Preferably, in the method for manufacturing a nitride semiconductor device in accordance with the present invention, in the step of forming the AlNO buffer layer, the AlNO buffer layer is formed to have a film thickness of not less than 5 nm and not more than 100 nm.

Preferably, in the method for manufacturing a nitride semiconductor device in accordance with the present invention, in the step of forming the AlNO buffer layer, the AlNO buffer layer is formed to cover not less than 90% of a surface of the substrate.

Preferably, in the method for manufacturing a nitride semiconductor device in accordance with the present invention, in the step of forming the AlNO buffer layer, the AlNO buffer layer is formed with the substrate having a temperature of not less than 300° C. and not more than 1000° C.

Preferably, in the method for manufacturing a nitride semiconductor device in accordance with the present invention, in the step of forming the AlNO buffer layer, the atmosphere immediately before formation of the AlNO buffer layer has a pressure of not more than $1 \times 10^{-4}$ Pa.

Preferably, the method for manufacturing a nitride semiconductor device in accordance with the present invention further includes the step of performing dummy discharge within a chamber of a sputtering apparatus, before the step of forming the AlNO buffer layer.

Preferably, in the method for manufacturing a nitride semiconductor device in accordance with the present invention, in the step of forming the AlNO buffer layer, the AlNO buffer layer is formed under a pressure of the atmosphere of not less than 0.2 Pa.

Preferably, in the method for manufacturing a nitride semiconductor device in accordance with the present invention, in the step of forming the AlNO buffer layer, the AlNO buffer layer is formed at a formation rate of not less than 0.01 nm/second and not more than 1 nm/second.

Preferably, in the method for manufacturing a nitride semiconductor device in accordance with the present invention, the substrate includes a sapphire substrate, and the nitride semiconductor layer includes an n-type nitride semiconductor layer, a nitride semiconductor active layer, and a p-type nitride semiconductor layer.

Preferably, in the method for manufacturing a nitride semiconductor device in accordance with the present invention, in the step of forming the AlNO buffer layer, the reactive sputtering method is performed by a DC magnetron sputtering method performed by applying a voltage between the substrate and the target arranged to have a distance of not less than 100 mm and not more than 250 mm therebetween, using a DC-continuous mode.

Preferably, in the method for manufacturing a nitride semiconductor device in accordance with the present invention, in the step of forming the AlNO buffer layer, the target is arranged to be inclined with respect to a surface of the substrate.

Further, the present invention is directed to a nitride semiconductor light-emitting device manufactured by a method for manufacturing a nitride semiconductor device as described above.

Furthermore, the present invention is directed to a light-emitting apparatus, including a nitride semiconductor light-emitting device as described above.

According to the present invention, by positively introducing oxygen when forming the buffer layer by the reactive sputtering method, crystallinity of the nitride semiconductor layer formed on the buffer layer is improved. As a result, a nitride semiconductor light-emitting device having excellent light emission characteristics can be manufactured.

In addition, according to the present invention, by positively introducing oxygen when forming the buffer layer, a buffer layer having excellent crystallinity can be formed efficiently and with good reproducibility, and thus a nitride semiconductor layer having excellent crystallinity can be formed on the buffer layer efficiently and with good reproducibility. As a result, a nitride semiconductor light-emitting device having excellent light emission characteristics can be manufactured efficiently and with good reproducibility.

DETAILED DESCRIPTION OF THE INVENTION

Figure 1:
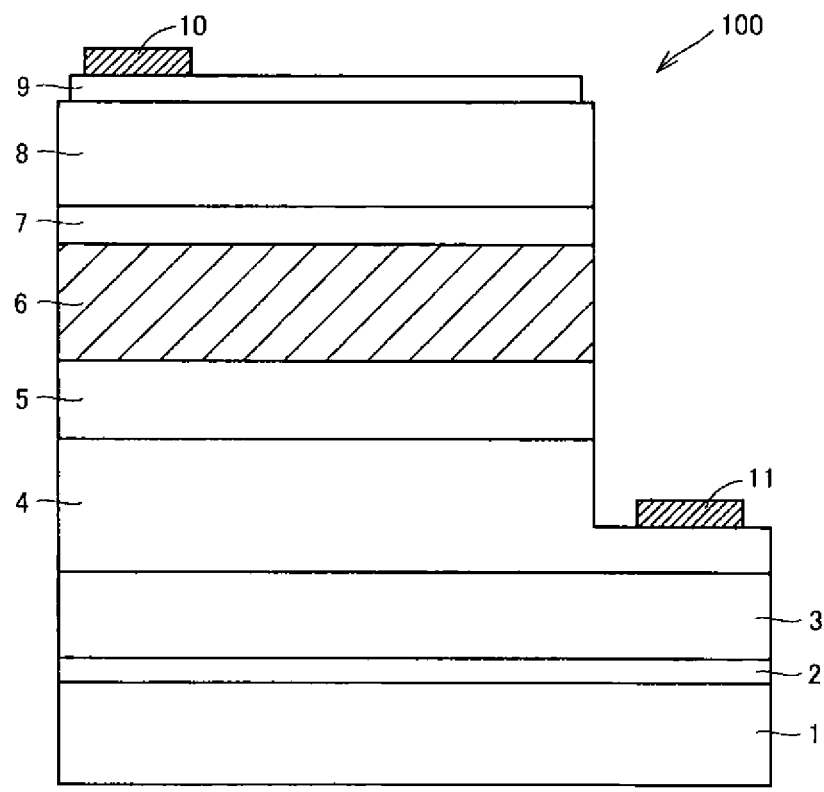
FIG. 1 is a schematic cross sectional view of a nitride semiconductor light-emitting diode device in accordance with an embodiment.

Hereinafter, an embodiment of the present invention will be described. It is to be noted that, in the drawings of the present invention, the same reference numerals designate identical or corresponding parts.

<Structure of Device>

FIG. 1 shows a schematic cross sectional view of a nitride semiconductor light-emitting diode device in accordance with an embodiment as one example of a nitride semiconductor device of the present invention.

A nitride semiconductor light-emitting diode device 100 in accordance with the embodiment includes a substrate 1, a buffer layer 2 of a nitride semiconductor containing oxygen and aluminum (hereinafter referred to as "aluminum oxynitride" or "AlNO") placed in contact with a surface of substrate 1, a nitride semiconductor underlying layer 3 placed in contact with a surface of AlNO buffer layer 2, an n-type nitride semiconductor contact layer 4 placed in contact with a surface of nitride semiconductor underlying layer 3, an n-type nitride semiconductor cladding layer 5 placed in contact with a surface of n-type nitride semiconductor contact layer 4, a nitride semiconductor active layer 6 placed in contact with a surface of n-type nitride semiconductor cladding layer 5, a p-type nitride semiconductor cladding layer 7 placed in contact with a surface of nitride semiconductor active layer 6, a p-type nitride semiconductor contact layer 8 placed in contact with a surface of p-type nitride semiconductor cladding layer 7, and a light-transmitting electrode layer 9 placed in contact with a surface of p-type nitride semiconductor contact layer 8. In addition, an n-side electrode 11 is placed to be in contact with an exposed surface of n-type nitride semiconductor contact layer 4, and a p-side electrode 10 is placed to be in contact with a surface of light-transmitting electrode layer 9.

As AlNO buffer layer 2, any AlNO buffer layer containing oxygen, nitrogen, and aluminum may be used, and, for example, a nitride semiconductor layer made of a nitride semiconductor represented by a formula $Al_{x0}Ga_{1-x0}N_{y0}O_{1-y0}$ ($0<x0\leq1$, $0<y0<1$) can be stacked. In particular, from the viewpoint of obtaining AlNO buffer layer 2 with good crystallinity made of an aggregate of columnar crystals having uniform crystal grains that extend in a direction of a normal to the surface (growth surface) of substrate 1, it is preferable to stack a nitride semiconductor layer made of a nitride semiconductor represented by a formula $AlN_{y0}O_{1-y0}$ ($0<y0<1$) as AlNO buffer layer 2.

<Manufacturing Method for Device>

Hereinafter, one example of a method for manufacturing nitride semiconductor light-emitting diode device 100 in accordance with the embodiment will be described.

Figure 2:
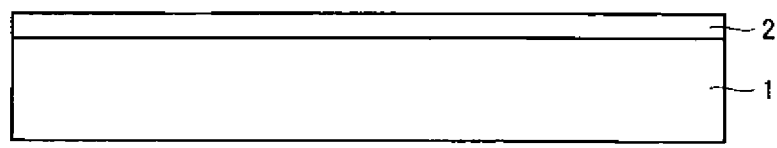
FIG. 2 is a schematic cross sectional view illustrating a portion of a manufacturing process in one example of a method for manufacturing the nitride semiconductor light-emitting diode device in accordance with the embodiment.

Firstly, as shown in a schematic cross sectional view in FIG. 2, AlNO buffer layer 2 is stacked on the surface of substrate 1. AlNO buffer layer 2 is formed by a DC magnetron sputtering method performed by applying a voltage between substrate 1 and a target using a DC-continuous mode. The method for forming AlNO buffer layer 2 is not limited to the DC magnetron sputtering method performed by applying a voltage using the DC-continuous mode, and, for example, an RF sputtering method, an ECR sputtering method, or another reactive sputtering method can be used.

<Substrate>

As substrate 1, for example, a substrate made of a sapphire (Al$_2$O$_3$) single crystal, a spinel (MgAl$_2$O$_4$) single crystal, a ZnO single crystal, a LiAlO$_2$ single crystal, a LiGaO$_2$ single crystal, a MgO single crystal, a Si single crystal, a SiC single crystal, a GaAs single crystal, an AlN single crystal, a GaN single crystal, or a boride single crystal such as ZrB$_2$, or the like having an exposed surface such as an a-plane, a c-plane, an m-plane, or an r-plane can be used. It is to be noted that a plane orientation of the growth surface of substrate 1 is not particularly limited, and a just substrate, a substrate provided with an off angle, or the like can be used as appropriate. In particular, using a sapphire substrate made of a sapphire single crystal as substrate 1 and forming AlNO buffer layer 2 described later on the c-plane of the sapphire substrate is preferable in that there is an increasing tendency that AlNO buffer layer 2 with good crystallinity made of an aggregate of columnar crystals having uniform crystal grains can be stacked.

<Pretreatment of Substrate>

The growth surface of substrate 1 before AlNO buffer layer 2 is stacked thereon may be subjected to pretreatment. The pretreatment of the growth surface of substrate 1 includes, as an example, treatment of hydrogen-terminating the growth surface of substrate 1 by performing RCA cleaning similar to that commonly performed on a silicon substrate. Thereby, there is a tendency that AlNO buffer layer 2 with good crystallinity can be stacked on the growth surface of substrate 1 with good reproducibility.

The pretreatment of the growth surface of substrate 1 includes, as another example, treatment of exposing the growth surface of substrate 1 to plasma of nitrogen gas. Thereby, there is a tendency that foreign substances such as organic substances and oxides sticking to the growth surface of substrate 1 can be removed and the condition of the growth surface of substrate 1 can be improved. In particular, when substrate 1 is a sapphire substrate, exposure of the growth surface of substrate 1 to plasma of nitrogen gas causes nitridation of the growth surface of substrate 1, and tends to facilitate in-plane uniform formation of AlNO buffer layer 2 to be stacked on the growth surface of substrate 1.

<Sputtering Apparatus>

Figure 3:
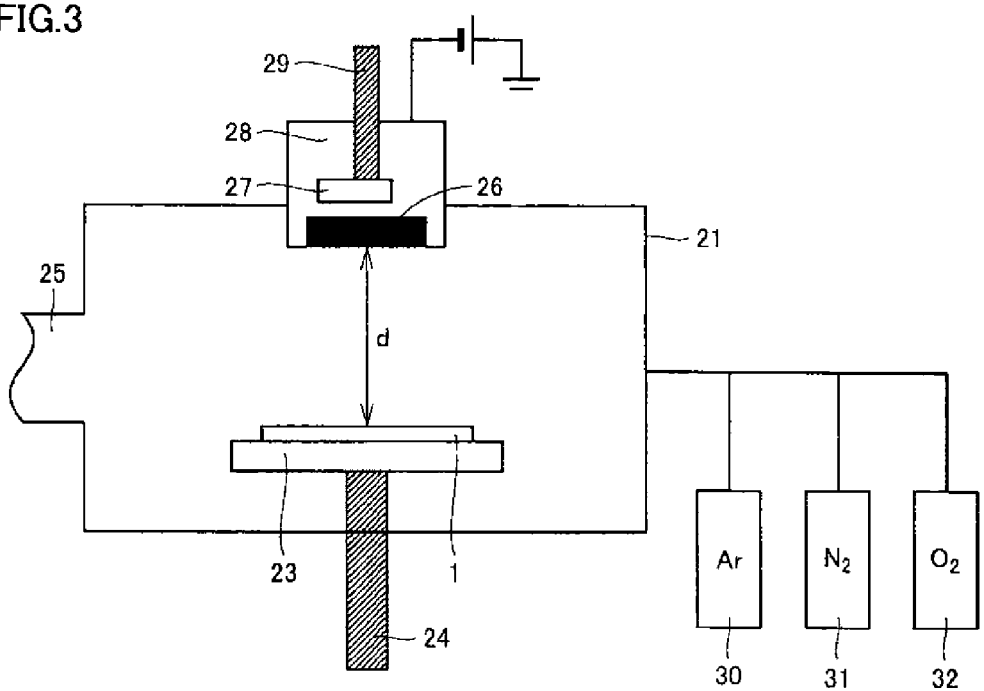
FIG. 3 is a schematic configuration diagram of one example of a DC magnetron sputtering apparatus used to stack an AlNO buffer layer on a surface of a substrate.

FIG. 3 shows a schematic configuration of one example of a DC magnetron sputtering apparatus used to stack AlNO buffer layer 2 on the surface of substrate 1.

The DC magnetron sputtering apparatus includes a chamber 21, a heater 23 placed at a lower portion inside chamber 21, a cathode 28 placed to face heater 23, and an exhaust port 25 for emitting a gas inside chamber 21 to the outside of chamber 21.

Heater 23 is supported by a heater support 24. Cathode 28 has an Al target 26 made of aluminum and a magnet 27 supported by a magnet support 29. Further, a mass flow controller 30 for supplying argon gas into chamber 21, a mass flow controller 31 for supplying nitrogen gas into chamber 21, and a mass flow controller 32 for supplying oxygen gas into chamber 21 are connected to chamber 21.

In stacking AlNO buffer layer 2 on the surface of substrate 1, firstly, substrate 1 is placed on heater 23 inside the DC magnetron sputtering apparatus having a configuration as described above. Substrate 1 is arranged such that the growth surface of substrate 1 (surface on which AlNO buffer layer 2 grows) faces a surface of Al target 26 with a predetermined distance d provided therebetween.

Distance d described above refers to the shortest distance between the center of the surface of Al target 26 and the growth surface of substrate 1. Distance d is set to preferably not less than 100 mm and not more than 250 mm, more preferably not less than 120 mm and not more than 210 mm, and further preferably not less than 150 mm and not more than 180 mm. When AlNO buffer layer 2 is stacked by the DC magnetron sputtering method, a high-energy reactive species is supplied to substrate 1. If distance d is set to not less than 100 mm, damage to the growth surface of substrate 1 caused by the above reactive species can be decreased. If distance d is set to not more than 250 mm, plasma discharge easily occurs, and the formation rate of AlNO buffer layer 2 is increased. Therefore, there is a tendency that AlNO buffer layer 2 with good crystallinity made of an aggregate of columnar crystals having uniform crystal grains that extend in the direction of the normal to the growth surface of substrate 1 (in a vertical direction) can be stacked. Accordingly, by growing a nitride semiconductor layer on the surface of AlNO buffer layer 2 with good crystallinity as described above, a nitride semiconductor layer (nitride semiconductor underlying layer 3 in the present embodiment) having low dislocation density and excellent crystallinity can be obtained with good reproducibility, and thus a nitride semiconductor device having good characteristics can be fabricated with good reproducibility.

When distance d is set to not less than 120 mm and not more than 210 mm, in particular not less than 150 mm and not more than 180 mm, AlNO buffer layer 2 with good crystallinity can be stacked. Therefore, there is an increasing tendency that a nitride semiconductor layer having low dislocation density and excellent crystallinity can be grown on the surface of such an AlNO buffer layer 2 with good reproducibility, and thus there is an increasing tendency that a nitride semiconductor device having good characteristics can be fabricated with good reproducibility.

Figure 4:
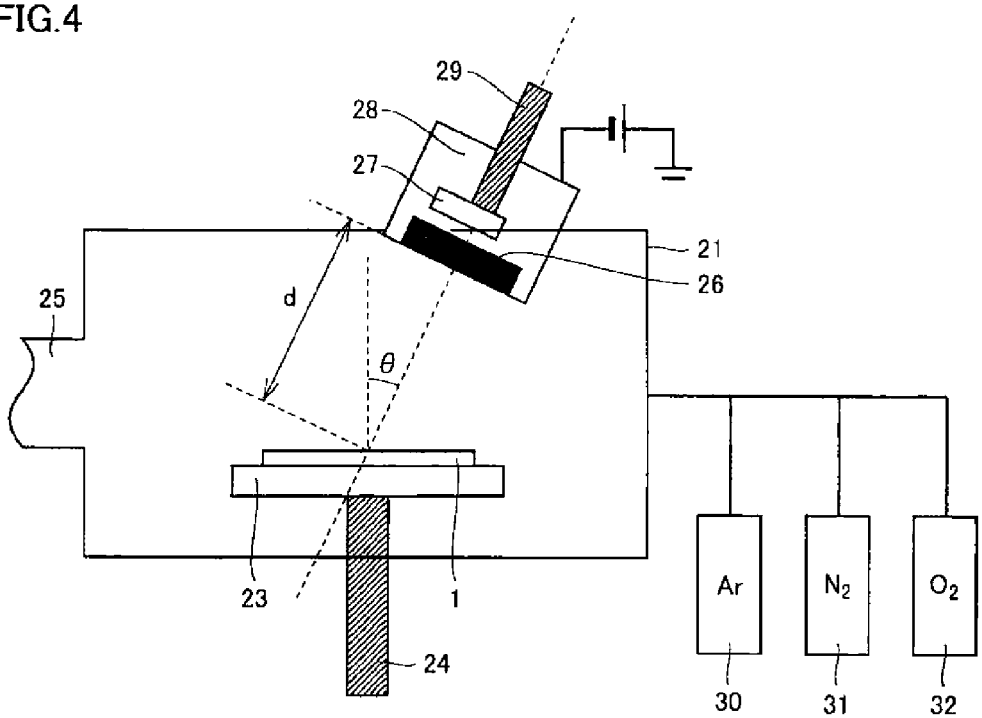
FIG. 4 is a schematic configuration diagram of another example of the DC magnetron sputtering apparatus used to stack the AlNO buffer layer on the surface of the substrate.

FIG. 4 shows a schematic configuration of another example of the DC magnetron sputtering apparatus used to stack AlNO buffer layer 2 on the surface of substrate 1. The DC magnetron sputtering apparatus having the configuration shown in FIG. 4 is characterized in that Al target 26 is arranged to be inclined with respect to the growth surface of substrate 1, with an interval provided between substrate 1 and Al target 26.

Here, Al target 26 is arranged to be inclined by an angle θ with respect to the direction of the normal to the growth surface of substrate 1. From the viewpoint of stacking AlNO buffer layer 2 excellent in crystallinity, angle θ is preferably not less than 10° and not more than 45°, and more preferably not less than 20° and not more than 45°.

When AlNO buffer layer 2 is stacked by the DC magnetron sputtering method by applying a voltage between substrate 1 and Al target 26 using the DC-continuous mode, with Al target 26 being arranged to be inclined with respect to the growth surface of substrate 1 with an interval provided between substrate 1 and Al target 26 as described above, damage to the growth surface of substrate 1 caused by a high-energy reactive species supplied to substrate 1 during stacking of AlNO buffer layer 2 can be decreased. Therefore, there is a tendency that AlNO buffer layer 2 excellent in crystallinity can be stacked. Further, there is a tendency that AlNO buffer layer 2 has uniform crystallinity and film thickness in a plane of substrate 1.

Also in the DC magnetron sputtering apparatus having the configuration shown in FIG. 4, shortest distance d between the center of the surface of Al target 26 and the growth surface of substrate 1 is set to preferably not less than 100 mm and not more than 250 mm, more preferably not less than 120 mm and not more than 210 mm, and further preferably not less than 150 mm and not more than 180 mm. Also in the DC magnetron sputtering apparatus having the configuration shown in FIG. 4, there is a tendency that AlNO buffer layer 2 excellent in crystallinity can be stacked by setting shortest distance d as described above, for the reason described above.

<Formation of AlNO Buffer Layer>

Next, nitrogen gas is continuously supplied from mass flow controller 31 and oxygen gas is continuously supplied from mass flow controller 32 into chamber 21, and thereby the nitrogen gas and the oxygen gas are continuously introduced to between substrate 1 and Al target 26. At the same time, the gas inside chamber 21 is continuously exhausted from exhaust port 25 to the outside.

Then, a voltage is applied between substrate 1 and Al target 26 using the DC-continuous mode to generate plasma of a mixed gas of the nitrogen gas and the oxygen gas between substrate 1 and Al target 26. Thereby, sputtering of Al target 26 is performed, and AlNO buffer layer 2 made of a compound of aluminum, nitrogen, and oxygen is stacked on the surface of substrate 1. It is to be noted that the DC-continuous mode is a mode to continuously apply a DC voltage (voltage whose direction does not vary depending on time) having a predetermined magnitude between substrate 1 and Al target 26 during sputtering of Al target 26.

The inventors of the present invention have found that, when AlNO buffer layer 2 is formed by the reactive sputtering method using Al target 26 as a target within chamber 21 while continuously introducing the nitrogen gas and the oxygen gas into chamber 21 and continuously exhausting the gas inside chamber 21 from exhaust port 25 to the outside of chamber 21 as described above, AlNO buffer layer 2 having low dislocation density and good crystallinity can be formed which allows a nitride semiconductor layer having excellent crystallinity to be formed thereon with good reproducibility, and have completed the present invention. This is considered to be because, since the atmosphere within chamber 21 is kept fresh by continuously introducing and exhausting the oxygen gas and the nitrogen gas to and from chamber 21 at certain flow rates, a ratio of a gas generated from the inner wall of chamber 21 to the gases constituting the atmosphere within chamber 21 is reduced.

<Flow Rate Ratio>

AlNO buffer layer 2 is formed in an atmosphere in which a ratio of a flow rate of the oxygen gas to the sum of a flow rate of the nitrogen gas and the flow rate of the oxygen gas is not more than 0.5%, and more preferably not more than 0.25%. When the ratio of the flow rate of the oxygen gas to the sum of the flow rate of the nitrogen gas and the flow rate of the oxygen gas is not more than 0.5%, and in particular not more than 0.25%, AlNO buffer layer 2 with good crystallinity can be stacked. Therefore, there is an increasing tendency that a nitride semiconductor layer having low dislocation density and excellent crystallinity can be grown on the surface of such an AlNO buffer layer 2 with good reproducibility, and thus there is an increasing tendency that a nitride semiconductor device having good characteristics can be fabricated with good reproducibility.

Here, AlNO buffer layer 2 is formed in an atmosphere in which the ratio of the flow rate of the oxygen gas to the sum of the flow rate of the nitrogen gas and the flow rate of the oxygen gas is preferably not less than 0.05%, and more preferably not less than 0.1%. When the ratio of the flow rate of the oxygen gas to the sum of the flow rate of the nitrogen gas and the flow rate of the oxygen gas is not less than 0.05%, and in particular not less than 0.1%, AlNO buffer layer 2 with good crystallinity can be stacked. Therefore, there is an increasing tendency that a nitride semiconductor layer having low dislocation density and excellent crystallinity can be grown on the surface of such an AlNO buffer layer 2 with good reproducibility, and thus there is an increasing tendency that a nitride semiconductor device having good characteristics can be fabricated with good reproducibility.

It is to be noted that, although the case where the nitrogen gas and the oxygen gas are supplied into chamber 21 has been described above, the present invention is not limited thereto, and, for example, at least a portion of the nitrogen gas may be replaced with ammonia gas.

<Degree of Coverage by AlNO Buffer Layer>

Preferably, AlNO buffer layer 2 is formed to cover not less than 90% of the surface of substrate 1. When AlNO buffer layer 2 covers not less than 90% of the surface of substrate 1, there is a tendency that AlNO buffer layer 2 can suppress formation of a hillock or a pit in the nitride semiconductor layer formed on AlNO buffer layer 2.

<Oxygen Concentration in AlNO Buffer Layer>

AlNO buffer layer 2 is formed to have an oxygen concentration of preferably not less than 1 atomic % and not more than 10 atomic %, more preferably not less than 2 atomic % and not more than 9 atomic %, and further preferably not less than 3 atomic % and not more than 7 atomic %. Although it has been conventionally believed that the oxygen concentration in buffer layer 2 should be not more than 1 atomic % as described above, the inventors of the present invention have found as a result of earnest studies that, when the oxygen concentration in AlNO buffer layer 2 is not less than 1 atomic % and not more than 10 atomic %, further not less than 2 atomic % and not more than 9 atomic %, and in particular not less than 3 atomic % and not more than 7 atomic %, there is an increasing tendency that a nitride semiconductor layer having low dislocation density and excellent crystallinity can be grown with good reproducibility, and thus there is an increasing tendency that a nitride semiconductor device having better characteristics can be fabricated with good reproducibility.

Preferably, AlNO buffer layer 2 is formed to have a uniform oxygen concentration throughout AlNO buffer layer 2. In this case, there is an increasing tendency that a nitride semiconductor layer having low dislocation density and excellent crystallinity can be grown with good reproducibility, and thus there is an increasing tendency that a nitride semiconductor device having better characteristics can be fabricated with good reproducibility. It is to be noted that, in order to say that the oxygen concentration in AlNO buffer layer 2 is uniform throughout AlNO buffer layer 2, it is only necessary that a difference in oxygen concentration between a portion of AlNO buffer layer 2 having the maximum oxygen concentration and a portion of AlNO buffer layer 2 having the minimum oxygen concentration is not more than 10 atomic %.

<Refractive Index of AlNO Buffer Layer>

AlNO buffer layer 2 is formed to have a refractive index of preferably not less than 2 and not more than 2.1, more preferably not less than 2.03 and not more than 2.08, and further preferably not less than 2.03 and not more than 2.05, for light with a wavelength of 450 nm. When AlNO buffer layer 2 has a refractive index of not less than 2 and not more than 2.1, further not less than 2.03 and not more than 2.08, and in particular not less than 2.03 and not more than 2.05, for light with a wavelength of 450 nm, there is an increasing tendency that a nitride semiconductor layer having low dislocation density and excellent crystallinity can be grown with good reproducibility, and thus there is an increasing tendency that a nitride semiconductor device having better characteristics can be fabricated with good reproducibility.

<Thickness of AlNO Buffer Layer>

AlNO buffer layer 2 stacked on the growth surface of substrate 1 preferably has a thickness of not less than 5 nm and not more than 100 nm. If AlNO buffer layer 2 has a thickness of less than 5 nm, AlNO buffer layer 2 may not fully exercise the function as a buffer layer. In addition, if AlNO buffer layer 2 has a thickness of more than 100 nm, only time of formation of AlNO buffer layer 2 may be increased without an improvement in the function as a buffer layer. Furthermore, from the viewpoint of causing AlNO buffer layer 2 to exercise the function as a buffer layer uniformly in the plane, it is more preferable to set the thickness of AlNO buffer layer 2 to not less than 10 nm and not more than 50 nm.

<Temperature of Substrate>

Preferably, substrate 1 during stacking of AlNO buffer layer 2 has a temperature of not less than 300° C. and not more than 1000° C. If substrate 1 during stacking of AlNO buffer layer 2 has a temperature of less than 300° C., there is a possibility that AlNO buffer layer 2 cannot fully cover the growth surface of substrate 1, and the growth surface of substrate 1 may be considerably exposed from AlNO buffer layer 2. In addition, if substrate 1 during stacking of AlNO buffer layer 2 has a temperature of more than 1000° C., there is a possibility that migration of source materials in the growth surface of substrate 1 becomes too active, and AlNO buffer layer 2 which is nearly a film of a single crystal rather than an aggregate of columnar crystals is formed, which may result in deterioration in the function of AlNO buffer layer 2 as a buffer layer.

<Ultimate Vacuum in Sputtering Apparatus>

Since it is desirable that no impurities exist inside chamber 21 during stacking of AlNO buffer layer 2, a pressure inside chamber 21 immediately before sputtering is preferably not more than $1 \times 10^{-4}$ Pa, from the viewpoint of obtaining AlNO buffer layer 2 with good crystallinity. Namely, the atmosphere immediately before formation of the AlNO buffer layer preferably has a pressure of not more than $1 \times 10^{-4}$ Pa.

<Dummy Discharge>

In order to further improve ultimate vacuum in chamber 21, it is preferable to perform dummy discharge within chamber 21 before formation of AlNO buffer layer 2. By performing such dummy discharge, impurities knocked out of chamber 21 can be removed beforehand.

As a method for performing dummy discharge, for example, a method such as performing the same discharge program as that used during formation of AlNO buffer layer 2 without introducing substrate 1 can be used.

Such dummy discharge can be performed not only by a method performed under the same conditions as those for forming AlNO buffer layer 2, but also under conditions which are set to cause impurities to be knocked out more easily. Examples of such conditions include a condition for setting a preset temperature for heating the substrate to be higher, a condition for setting power for generating plasma to be higher, and the like.

Dummy discharge in which the step of supplying only the argon gas and the step of supplying the gases used during formation of AlNO buffer layer 2 are alternately repeated with plasma being continuously generated within chamber 21 is also effective to improve ultimate vacuum. In the dummy discharge, it is important to thinly coat the inner wall of chamber 21 with an aluminum-rich metal film in the step of supplying only the argon gas, because impurities are easily adsorbed onto the aluminum-rich metal film. However, the dummy discharge preferably ends with the step of supplying the gases used under the conditions for forming AlNO buffer layer 2. This is because, if the dummy discharge ends with the step of supplying only the argon gas, the aluminum-rich metal film covers the inner wall of chamber 21, and thus the inner wall becomes significantly unstable, and if AlNO buffer layer 2 is formed with the inner wall of chamber 21 being unstable, film quality characteristics of AlNO buffer layer 2 tends to have poor reproducibility.

By further improving ultimate vacuum within chamber 21 before formation of AlNO buffer layer 2 by performing the dummy discharge as described above, an oxygen-containing substance existing in the inner wall or a space of chamber 21 can be removed and reduced more reliably.

<Pressure Inside Chamber During Stacking of AlNO Buffer Layer>

Preferably, the pressure inside chamber 21 during stacking of AlNO buffer layer 2 is not less than 0.2 Pa. If the pressure inside chamber 21 during stacking of AlNO buffer layer 2 is less than 0.2 Pa, there is a possibility that the amount of nitrogen inside chamber 21 is reduced, and aluminum sputtered from Al target 26 may stick to the growth surface of substrate 1 in a non-nitride state. Furthermore, the upper limit of the pressure inside chamber 21 during stacking of AlNO buffer layer 2 is not particularly limited, and it may be any pressure at a level which allows plasma to be generated inside chamber 21.

<Formation Rate of AlNO Buffer Layer>

Preferably, AlNO buffer layer 2 is formed at a formation rate of not less than 0.01 nm/second and not more than 1 nm/second. If the formation rate of AlNO buffer layer 2 is less than 0.01 nm/second, there is a possibility that AlNO buffer layer 2 does not spread out uniformly but grows in the form of an island on the growth surface of substrate 1 and AlNO buffer layer 2 cannot cover the growth surface of substrate 1 uniformly, and the growth surface of substrate 1 is exposed from AlNO buffer layer 2. In addition, if the formation rate of AlNO buffer layer 2 is more than 1 nm/second, there is a possibility that AlNO buffer layer 2 becomes amorphous and a nitride semiconductor layer having low dislocation density and excellent crystallinity cannot be grown on AlNO buffer layer 2.

<Formation of Nitride Semiconductor Underlying Layer>

Figure 5:
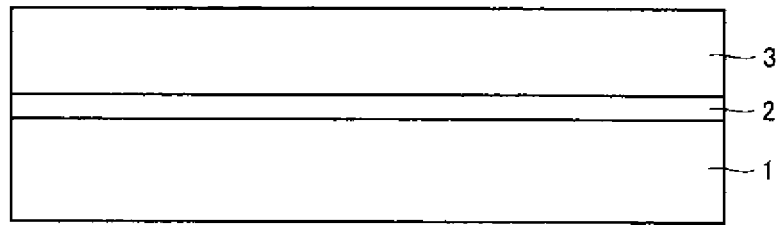
FIG. 5 is a schematic cross sectional view illustrating a portion of the manufacturing process in one example of the method for manufacturing the nitride semiconductor light-emitting diode device in accordance with the embodiment.

Next, as shown in a schematic cross sectional view in FIG. 5, nitride semiconductor underlying layer 3 is stacked on the surface of AlNO buffer layer 2 by an MOCVD (Metal Organic Chemical Vapor Deposition) method.

As nitride semiconductor underlying layer 3, for example, a nitride semiconductor layer made of a group III nitride semiconductor represented by a formula $Al_{x1}Ga_{y1}In_{z1}N$ ($0 \le x1 \le 1$, $0 \le y1 \le 1$, $0 \le z1 \le 1$, $x1+y1+z1 \ne 0$) can be stacked. In order to prevent continuation of a crystal defect such as dislocation in AlNO buffer layer 2 made of an aggregate of columnar crystals, nitride semiconductor underlying layer 3 preferably contains Ga or In as a group III element. In order to prevent continuation of dislocation in AlNO buffer layer 2, it is necessary to loop the dislocation in the vicinity of an interface with AlNO buffer layer 2. When nitride semiconductor underlying layer 3 is made of a group III nitride semiconductor containing Ga or In, a dislocation loop is easily generated. Accordingly, by using nitride semiconductor underlying layer 3 made of a group III nitride semiconductor containing Ga or In, dislocation can be looped and confined in the vicinity of the interface with AlNO buffer layer 2, and thus continuation of the dislocation from AlNO buffer layer 2 to nitride semiconductor underlying layer 3 can be suppressed. In particular, if nitride semiconductor underlying layer 3 is made of a group III nitride semiconductor represented by a formula $Al_{x1}Ga_{y1}N$ ($0<x1<1$, $0<y1<1$), in particular made of GaN, dislocation can be looped and confined in the vicinity of the interface with AlNO buffer layer 2. Therefore, nitride semiconductor underlying layer 3 having low dislocation density and good crystallinity tends to be obtained.

The surface of AlNO buffer layer 2 immediately before stacking of nitride semiconductor underlying layer 3 may be subjected to heat treatment. The heat treatment tends to allow cleaning of the surface and improvement of the crystallinity of AlNO buffer layer 2. The heat treatment can be performed, for example, within an MOCVD apparatus in which the MOCVD method is used, and, for example, hydrogen gas, nitrogen gas, or the like can be used as an atmosphere gas for the heat treatment. In addition, in order to prevent decomposition of AlNO buffer layer 2 during the above heat treatment, ammonia gas may be mixed into the atmosphere gas for the heat treatment. Furthermore, the above heat treatment can be performed at a temperature of, for example, not less than 900° C. and not more than 1250° C., for a time period of, for example, not less than one minute and not more than 60 minutes.

Although nitride semiconductor underlying layer 3 may be doped with an n-type dopant in a range of not less than $1\times10^{17}$ cm$^{-3}$ and not more than $1\times10^{19}$ cm$^{-3}$, nitride semiconductor underlying layer 3 is preferably undoped, from the viewpoint of maintaining good crystallinity. It is to be noted that, for example, silicon, germanium, tin, or the like can be used as the n-type dopant, and in particular, silicon and/or germanium is preferably used.

The temperature of substrate 1 during stacking of nitride semiconductor underlying layer 3 is preferably not less than 800° C. and not more than 1250° C., and more preferably not less than 1000° C. and not more than 1250° C. When the temperature of substrate 1 during stacking of nitride semiconductor underlying layer 3 is not less than 800° C. and not more than 1250° C., and in particular not less than 1000° C. and not more than 1250° C., there is a tendency that nitride semiconductor underlying layer 3 excellent in crystallinity can be grown.

<Formation of Nitride Semiconductor Layer>

Figure 6:
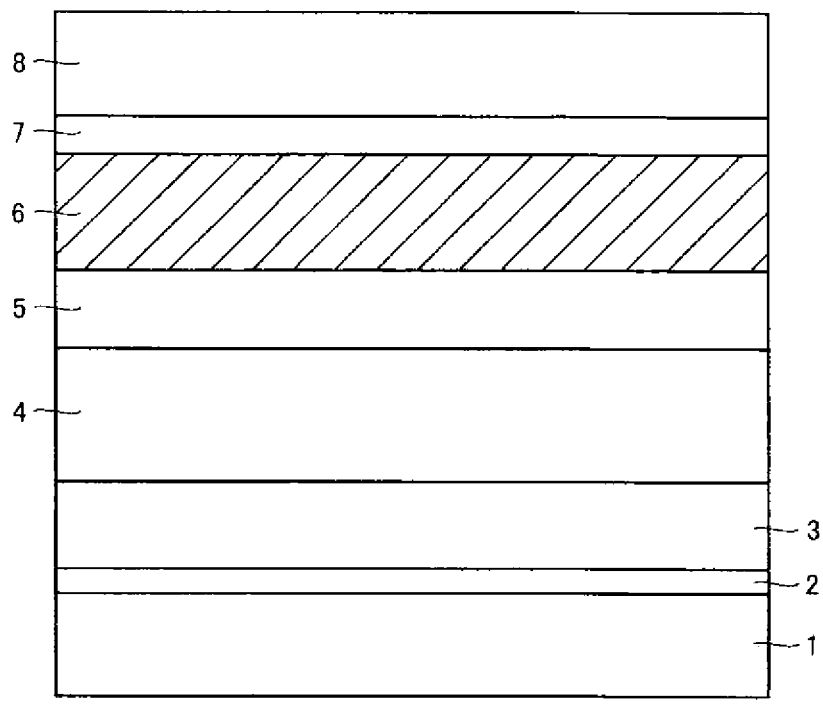
FIG. 6 is a schematic cross sectional view illustrating a portion of the manufacturing process in one example of the method for manufacturing the nitride semiconductor light-emitting diode device in accordance with the embodiment.

Next, as shown in a schematic cross sectional view in FIG. 6, n-type nitride semiconductor contact layer 4, n-type nitride semiconductor cladding layer 5, nitride semiconductor active layer 6, p-type nitride semiconductor cladding layer 7, and p-type nitride semiconductor contact layer 8 are stacked in this order on the surface of nitride semiconductor underlying layer 3 by the MOCVD method to form a stacked body.

<N-Type Nitride Semiconductor Contact Layer>

As n-type nitride semiconductor contact layer 4, for example, a layer obtained by doping, with an n-type dopant, a nitride semiconductor layer made of a group III nitride semiconductor represented by a formula $Al_{x2}Ga_{y2}In_{z2}N$ ($0\le x2\le 1$, $0\le y2\le 1$, $0\le z2\le 1$, $x2+y2+z2\ne 0$) can be stacked.

In particular, n-type nitride semiconductor contact layer 4 is preferably a nitride semiconductor layer obtained by doping, with silicon serving as the n-type dopant, a group III nitride semiconductor represented by a formula $Al_{x2}Ga_{1-x2}N$ ($0\le x2\le 1$, preferably $0\le x2\le 0.5$, and more preferably $0\le x2\le 0.1$).

The doping concentration of the n-type dopant in n-type nitride semiconductor contact layer 4 is preferably within a range of not less than $5\times10^{17}$ cm$^{-3}$ and not more than $5\times10^{19}$ cm$^{-3}$, from the viewpoint of maintaining good ohmic contact with n-side electrode 11 as well as suppressing occurrence of cracks and maintaining good crystallinity in n-type nitride semiconductor contact layer 4.

The sum of the thickness of nitride semiconductor underlying layer 3 and the thickness of n-type nitride semiconductor contact layer 4 is preferably not less than 4 μm and not more than 20 μm, more preferably not less than 4 μm and not more than 15 μm, and further preferably not less than 6 μm and not more than 15 μm, from the viewpoint of maintaining good crystallinity of these layers. If the sum of the thickness of nitride semiconductor underlying layer 3 and the thickness of n-type nitride semiconductor contact layer 4 is less than 4 μm, crystallinity of these layers may be deteriorated, or a pit may be formed in the surfaces of these layers. On the other hand, if the sum of the thickness of nitride semiconductor underlying layer 3 and the thickness of n-type nitride semiconductor contact layer 4 is more than 20 μm, warpage of substrate 1 may be increased, and the yield of the device may be reduced.

<N-Type Nitride Semiconductor Cladding Layer>

As n-type nitride semiconductor cladding layer 5, for example, a layer obtained by doping, with an n-type dopant, a nitride semiconductor layer made of a group III nitride semiconductor represented by a formula $Al_{x3}Ga_{y3}In_{z3}N$ ($0\le x3\le 1$, $0\le y3\le 1$, $0\le z3\le 1$, $x3+y3\le z3\ne 0$) can be stacked. N-type nitride semiconductor cladding layer 5 may have a heterojunction structure of a plurality of nitride semiconductor layers each made of a group III nitride semiconductor or a superlattice structure. In addition, n-type nitride semiconductor cladding layer 5 preferably has a bandgap larger than that of nitride semiconductor active layer 6 described later, from the viewpoint of confining light in nitride semiconductor active layer 6. Although the thickness of n-type nitride semiconductor cladding layer 5 is not particularly limited, it is preferably not less than 0.005 μm and not more than 0.5 μm, and more preferably not less than 0.005 μm and not more than 0.1 μm. The doping concentration of the n-type dopant in n-type nitride semiconductor cladding layer 5 is preferably not less than $1\times10^{17}$ cm$^{-3}$ and not more than $1\times10^{20}$ cm$^{-3}$, and more preferably not less than $1\times10^{18}$ cm$^{-3}$ and not more than $1\times10^{19}$ cm$^{-3}$, from the viewpoint of maintaining good crystallinity and reducing an operation voltage of the device.

<Nitride Semiconductor Active Layer>

Further, when nitride semiconductor active layer 6 has, for example, a single quantum well (SQW) structure, for example, a layer in which a nitride semiconductor layer made of a group III nitride semiconductor represented by a formula $Ga_{1-z4}In_{z4}N$ ($0<z4<0.4$) is configured as a quantum well layer can be used as nitride semiconductor active layer 6, and its In composition and thickness are controlled to obtain a desired light emission wavelength. Although the thickness of nitride semiconductor active layer 6 is not particularly limited, it is preferably not less than 1 nm and not more than 10 nm, and more preferably not less than 1 nm and not more than 6 nm, from the viewpoint of improving light emission output.

The temperature of substrate 1 during formation of nitride semiconductor active layer 6 is preferably not less than 700° C. and not more than 900° C., and more preferably not less than 750° C. and not more than 850° C. If the temperature of substrate 1 during formulation of nitride semiconductor active layer 6 is less than 700° C., crystallinity of nitride semiconductor active layer 6 may be deteriorated. On the other hand, if the temperature of substrate 1 during formation of nitride semiconductor active layer 6 is more than 900° C., sublimation of InN becomes significant, and thus the efficiency of incorporating In into a solid phase may be reduced and the In composition may vary.

Furthermore, as nitride semiconductor active layer 6, for example, a layer having a multiple quantum well (MQW) structure can also be used, which is obtained by alternately stacking a nitride semiconductor layer made of a group III nitride semiconductor represented by the formula $Ga_{1-z4}In_{z4}N$ ($0<z4<0.4$), serving as a quantum well layer, and a nitride semiconductor layer made of a nitride semiconductor represented by a formula $Al_{x5}Ga_{y5}In_{z5}N$ ($0 \leq x5 \leq 1$, $0 \leq y5 \leq 1$, $0 \leq z5 \leq 1$, $x5+y5+z5 \neq 0$) with a bandgap larger than that of the well layer, serving as a quantum barrier layer, one by one. It is to be noted that the quantum well layer and/or the quantum barrier layer described above may be doped with an n-type or a p-type dopant.

<P-Type Nitride Semiconductor Cladding Layer>

As p-type nitride semiconductor cladding layer 7, for example, a layer obtained by doping, with a p-type dopant, a nitride semiconductor layer made of a group III nitride semiconductor represented by a formula $Al_{x6}Ga_{y6}In_{z6}N$ ($0 \leq x6 \leq 1$, $0 \leq y6 \leq 1$, $0 \leq z6 \leq 1$, $x6+y6+z6 \neq 0$) can be stacked. In particular, it is preferable to stack a layer obtained by doping, with a p-type dopant, a nitride semiconductor layer made of a group III nitride semiconductor represented by a formula $Al_{x6}Ga_{1-x6}N$ ($0 < x6 \leq 0.4$, preferably $0.1 \leq x6 \leq 0.3$). It is to be noted that, for example, magnesium or the like can be used as the p-type dopant.

P-type nitride semiconductor cladding layer 7 preferably has a bandgap larger than that of nitride semiconductor active layer 6, from the viewpoint of confining light in nitride semiconductor active layer 6. Although the thickness of p-type nitride semiconductor cladding layer 7 is not particularly limited, it is preferably not less than 0.01 μm and not more than 0.4 μm, and more preferably not less than 0.02 μm and not more than 0.1 μm. The doping concentration of the p-type dopant in p-type nitride semiconductor cladding layer 7 is preferably not less than $1 \times 10^{18}$ cm$^{-3}$ and not more than $1 \times 10^{21}$ cm$^{-3}$, and more preferably not less than $1 \times 10^{19}$ cm$^{-3}$ and not more than $1 \times 10^{20}$ cm$^{-3}$, from the viewpoint of obtaining p-type nitride semiconductor cladding layer 7 with good crystallinity.

<P-Type Nitride Semiconductor Contact Layer>

As p-type nitride semiconductor contact layer 8, for example, a layer obtained by doping, with a p-type dopant, a nitride semiconductor layer made of a group III nitride semiconductor represented by a formula $Al_{x7}Ga_{y7}In_{z7}N$ ($0 \leq x7 \leq 1$, $0 \leq y7 \leq 1$, $0 \leq z7 \leq 1$, $x7+y7+z7 \neq 0$) can be stacked. In particular, it is preferable to use a layer obtained by doping a GaN layer with a p-type dopant, from the viewpoint of maintaining good crystallinity and obtaining good ohmic contact.

The doping concentration of the p-type dopant in p-type nitride semiconductor contact layer 8 is preferably within a range of not less than $1 \times 10^{18}$ cm$^{-3}$ and not more than $1 \times 10^{21}$ cm$^{-3}$, and more preferably within a range of not less than $5 \times 10^{19}$ cm$^{-3}$ and not more than $5 \times 10^{20}$ cm$^{-3}$, from the viewpoint of maintaining good ohmic contact as well as suppressing occurrence of cracks and maintaining good crystallinity in p-type nitride semiconductor contact layer 8. In addition, although the thickness of p-type nitride semiconductor contact layer 8 is not particularly limited, it is preferably not less than 0.01 μm and not more than 0.5 μm, and more preferably not less than 0.05 μm and not more than 0.2 μm, from the viewpoint of improving the light emission output of nitride semiconductor light-emitting diode device 100.

<MOCVD Method>

When n-type nitride semiconductor contact layer 4, n-type nitride semiconductor cladding layer 5, nitride semiconductor active layer 6, p-type nitride semiconductor cladding layer 7, and p-type nitride semiconductor contact layer 8 described above are each made of a group III nitride semiconductor, these layers are stacked by the MOCVD method, for example as described below.

Specifically, these layers can be stacked by supplying, for example, an organic metal source gas of at least one group III element selected from the group consisting of trimethyl gallium (TMG), trimethyl aluminum (TMA), and trimethyl indium (TMI), and, for example, nitrogen source gas such as ammonia, into a reactor of the MOCVD apparatus, and thermally decomposing and reacting these source gases.

Further, when doping with silicon serving as the n-type dopant is performed, doping with silicon can be performed by supplying, for example, silane ($SiH_4$) or disilane ($Si_2H_4$) as a doping gas into the reactor of the MOCVD apparatus, in addition to the above source gases.

Furthermore, when doping with magnesium serving as the p-type dopant is performed, doping with magnesium can be performed by supplying, for example, biscyclopentadienyl magnesium ($CP_2Mg$) as a doping gas into the reactor of the MOCVD apparatus, in addition to the above source gases.

<Formation of Electrodes>

Figure 7:
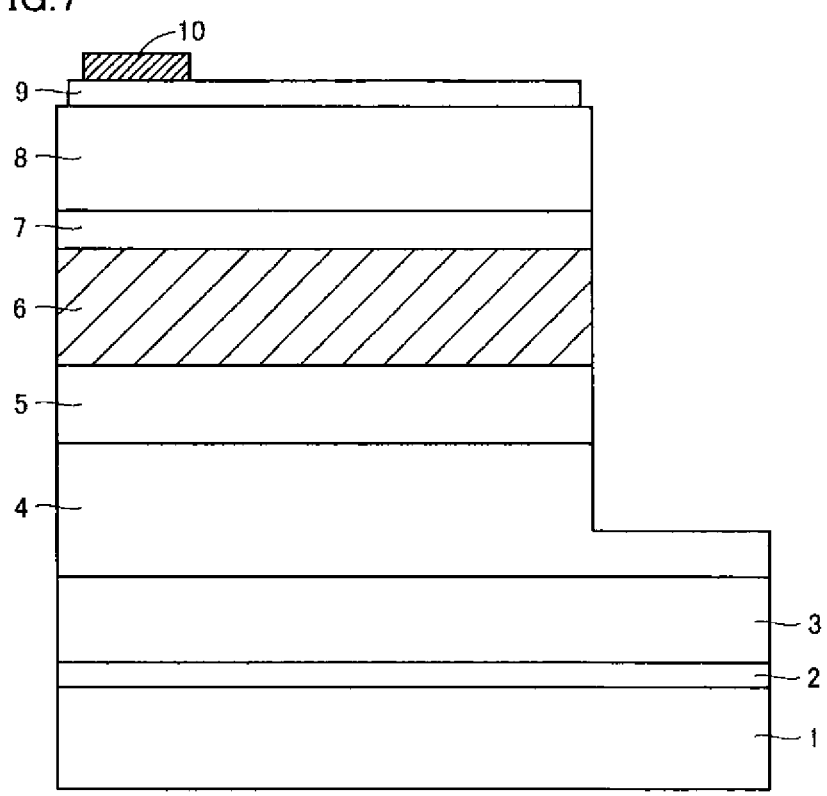
FIG. 7 is a schematic cross sectional view illustrating a portion of the manufacturing process in one example of the method for manufacturing the nitride semiconductor light-emitting diode device in accordance with the embodiment.

Next, as shown in a schematic cross sectional view in FIG. 7, light-transmitting electrode layer 9 made of, for example, ITO (Indium Tin Oxide), ZnO, or IZO (Indium Zinc Oxide) is formed on the surface of p-type nitride semiconductor contact layer 8, and then p-side electrode 10 is formed on the surface of light-transmitting electrode layer 9. Thereafter, a portion of the stacked body having p-side electrode 10 formed thereon is removed by etching to expose a portion of the surface of n-type nitride semiconductor contact layer 4.

Thereafter, as shown in FIG. 1, n-side electrode 11 is formed on the exposed surface of n-type nitride semiconductor contact layer 4. As a result, nitride semiconductor light-emitting diode device 100 in accordance with the embodiment can be fabricated.

<Characteristics of Device>

In nitride semiconductor light-emitting diode device 100 in accordance with the embodiment fabricated as described above, nitride semiconductor underlying layer 3, n-type nitride semiconductor contact layer 4, n-type nitride semiconductor cladding layer 5, nitride semiconductor active layer 6, p-type nitride semiconductor cladding layer 7, and p-type nitride semiconductor contact layer 8 are stacked in this order on the surface of AlNO buffer layer 2 with good crystallinity made of an aggregate of columnar crystals having uniform crystal grains that extend in the direction of the normal to the growth surface of substrate 1 (in the vertical direction), as described above. Therefore, these layers stacked on the surface of AlNO buffer layer 2 have low dislocation density and excellent crystallinity. Accordingly, nitride semiconductor light-emitting diode device 100 in accordance with the embodiment formed of such layers having excellent crystallinity achieves low operation voltage and high light emission output.

<Light-Emitting Apparatus>

Figure 8:
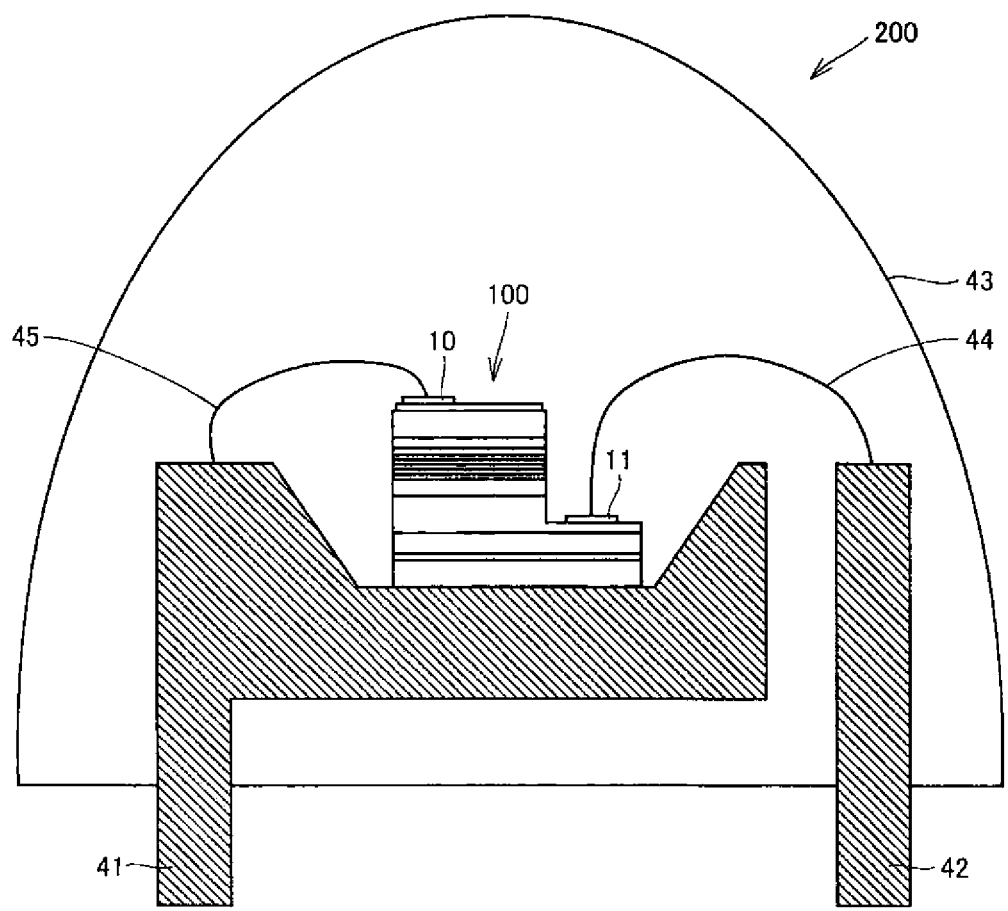
FIG. 8 is a schematic cross sectional view of one example of a light-emitting apparatus using the nitride semiconductor light-emitting diode device in accordance with the embodiment.

FIG. 8 shows a schematic cross sectional view of one example of a light-emitting apparatus using nitride semiconductor light-emitting diode device 100 in accordance with the embodiment. Here, a light-emitting apparatus 200 having a configuration shown in FIG. 8 is configured such that nitride semiconductor light-emitting diode device 100 in accordance with the embodiment is placed on a first lead frame 41. P-side electrode 10 of nitride semiconductor light-emitting diode device 100 is electrically connected with first lead frame 41 using a first wire 45, and n-side electrode 11 of nitride semiconductor light-emitting diode device 100 is electrically connected with a second lead frame 42 using a second wire 44. Furthermore, nitride semiconductor light-emitting diode device 100 is molded with a transparent mold resin 43, and thus light-emitting apparatus 200 has the shape of a bombshell.

Since the light-emitting apparatus having the configuration shown in FIG. 8 uses nitride semiconductor light-emitting diode device 100 in accordance with the embodiment, the light-emitting apparatus can achieve low operation voltage and high light emission output.

In Example 1, as shown in FIG. 2, on substrate 1 made of a sapphire substrate having a flat surface, AlNO buffer layer 2 was stacked by the reactive sputtering method using the sputtering apparatus shown in FIG. 3, under various conditions, and characteristics of each AlNO buffer layer 2 were investigated. In addition, on each AlNO buffer layer 2, nitride semiconductor underlying layer 3 made of undoped GaN was stacked by the MOCVD method, and characteristics of each nitride semiconductor underlying layer 3 were investigated.

Specifically, firstly, without placing substrate 1 made of a sapphire substrate on heater 23 of the sputtering apparatus shown in FIG. 3, argon gas whose flow rate was controlled by mass flow controller 30 was supplied into chamber 21, and a gas in the same amount as that of the supplied argon gas was exhausted from exhaust port 25 using a vacuum pump. Thereby, the pressure inside chamber 21 was maintained constant.

Next, a voltage was applied between heater 23 and Al target 26 to generate plasma of the argon gas between heater 23 and Al target 26. Generation of the plasma of the argon gas was maintained for a few minutes, and the inner wall of chamber 21 was thinly coated with an aluminum-rich metal film. The generation of the plasma of the argon gas was further maintained, and the argon gas was switched to nitrogen gas. On this occasion, variation in the pressure inside chamber 21 was preferably small. Subsequently, generation of nitrogen plasma was maintained for a few minutes, and the inner wall of chamber 21 was coated with an AlN film.

Next, substrate 1 was placed on heater 23 inside chamber 21 (with minimum distance d of 180 mm between the surface of substrate 1 and the surface of Al target 26). Then, substrate 1 was heated by heater 23 to have a temperature of 500° C., and the state where substrate 1 had a temperature of 500° C. was maintained for 10 minutes.

Next, nitrogen gas whose flow rate was controlled by mass flow controller 31 and oxygen gas whose flow rate was controlled by mass flow controller 32 were supplied into chamber 21, and a gas in the same amount as those of the supplied gases was exhausted through exhaust port 25 using the vacuum pump. Thereby, the pressure inside chamber 21 was maintained constant.

Next, a voltage was applied between substrate 1 and Al target 26 to generate plasma of the nitrogen gas and the oxygen gas between substrate 1 and Al target 26. Thereby, aluminum of Al target 26 was sputtered, and reactive sputtering in which aluminum reacts with oxygen and nitrogen in the plasma was performed. As a result, 25 nm-thick AlNO buffer layer 2 made of a compound of aluminum, nitrogen, and oxygen was formed on the entire surface of substrate 1. On this occasion, AlNO buffer layer 2 had a formation rate of 0.04 nm/second. The pressure inside chamber 21 immediately before sputtering was not more than $1 \times 10^{-4}$ Pa. The pressure inside chamber 21 during stacking of AlNO buffer layer 2 was set to a pressure of the atmosphere of not less than 0.2 Pa.

As described above, AlNO buffer layers 2 of samples 1 to 6 were formed under various conditions indicated in the column of conditions for forming the AlNO buffer layer in Table 1, and an X-ray half value width [arcsec], an oxygen concentration [atomic %], and a refractive index of each of AlNO buffer layers 2 of samples 1 to 6 were measured. Table 1 shows results thereof.

It is to be noted that the X-ray half value width [arcsec] in Table 1 was calculated by measuring a half value width of a peak of a rocking curve detected by X-ray diffraction measurement when a (002) plane of an AlN crystal, a (004) plane of a GaN crystal, and a (102) plane of the GaN crystal were each used as a reflection surface. Since a crystal with a lower value of the X-ray half value width is considered as a good crystal with less dislocation, this value is used as a measure for evaluating crystallinity.

The oxygen concentration [atomic %] in Table 1 was measured by XPS (X-ray photoelectron spectroscopy).

The refractive index in Table 1 indicates a refractive index for light with a wavelength of 450 nm, and was measured by a spectroscopic ellipsometer.

Next, substrate 1 having AlNO buffer layer 2 stacked thereon was taken out from chamber 21 of the sputtering apparatus shown in FIG. 3, and was placed inside the reactor of the MOCVD apparatus.

Thereafter, while ammonia gas as well as the nitrogen gas and the hydrogen gas as carrier gases were supplied into the reactor, the temperature of substrate 1 was raised to 1125° C. over about 15 minutes. Here, the pressure inside the reactor was set to normal pressure, and the flow rate ratio between the hydrogen gas and the nitrogen gas (the flow rate of the hydrogen gas/the flow rate of the nitrogen gas) serving as the carrier gases was set to 50/50. After it was confirmed that the temperature of substrate 1 became stable at 1125° C., supply of TMG (trimethyl gallium) gas into the reactor was started, and 5 μm-thick nitride semiconductor underlying layer (GaN layer) 3 made of undoped GaN was stacked on the surface of AlNO buffer layer 2 by the MOCVD method as shown in FIG. 5.

As described above, GaN layers 3 of samples 1 to 6 were formed on the surfaces of AlNO buffer layers 2 of samples 1 to 6, respectively, and an X-ray half value width [arcsec] of each of GaN layers 3 of samples 1 to 6 when the (004) plane of the GaN crystal and the (102) plane of the GaN crystal were each used as a reflection surface was measured. Table 1 shows results thereof.

TABLE 1

| | Conditions for Forming AlNO Buffer Layer | | | Characteristics of AlNO Buffer Layer | | | Characteristics of GaN Layer | |
| --- | --- | --- | --- | --- | --- | --- | --- | --- |
| Samples | Nitrogen Gas Flow Rate [sscm] | Oxygen Gas Flow Rate [sscm] | Ratio of Oxygen Gas Flow Rate to Flow Rates of All Gases | X-ray Half Value Width AlN (002) [arcsec] | Oxygen Concentration [atomic %] | Refractive Index | X-ray Half Value Width GaN (004) [arcsec] | X-ray Half Value Width GaN (102) [arcsec] |
| 1 | 40 | 0 | 0% | 282 | 2 | 2.11 | 642 | 632 |
| 2 | 40 | 0.02 | 0.05% | 286 | 2 | 2.08 | 53 | 298 |
| 3 | 40 | 0.04 | 0.10% | 284 | 3 | 2.05 | 41 | 263 |
| 4 | 40 | 0.10 | 0.25% | 280 | 7 | 2.03 | 48 | 301 |
| 5 | 40 | 0.20 | 0.5% | 298 | 9 | 2.03 | 66 | 320 |
| 6 | 40 | 0.40 | 0.99% | broad | 12 | 2.06 | broad | broad |

The following findings were obtained from the results shown in Table 1:

(a) The characteristics of AlNO buffer layer 2 of sample 1 formed without passing the oxygen gas at all were substantially identical to the characteristics of AlNO buffer layer 2 of sample 2 formed by passing the oxygen gas in a minute amount (0.05%). AlNO buffer layers 2 of samples 1 and 2 had X-ray half value widths of 282 [arcsec] and 286 [arcsec], respectively, and both had an oxygen concentration of 2 atomic %. However, AlNO buffer layers 2 of samples 1 and 2 had refractive indexes of 2.11 and 2.08, respectively, for light with a wavelength of 450 nm, and there was a slight difference therebetween. On the other hand, the GaN layers of samples 1 and 2 had a large difference in characteristics, and the X-ray half value widths of the GaN layers of samples 1 and 2 when GaN(004) was used as a reflection surface were 642 [arcsec] and 53 [arcsec], respectively.

(b) When the ratio of the oxygen gas flow rate was increased from 0% to 0.99%, the oxygen concentration in AlNO buffer layer 2 was also increased from 2 atomic % to 12 atomic % in accordance with the increase. On the other hand, when the ratio of the oxygen gas flow rate was increased from 0% to 0.5% (from sample 1 to sample 5), the refractive index of AlNO buffer layer 2 was monotonically decreased from 2.11 to 2.03. However, when the ratio of the oxygen gas flow rate was increased to 0.99% (sample 6), the refractive index was conversely increased to 2.06.

(c) In AlNO buffer layers 2 of sample 2 to 5 which achieved good GaN characteristics, the X-ray half value width for the AlN(002) plane was not more than 300 [arcsec], and the refractive index was not more than 2.08. Accordingly, it was confirmed that, in forming an AlNO buffer layer by reactive sputtering, the ratio of the oxygen gas flow rate (oxygen gas flow rate×100/total flow rates of all gases) is preferably not more than 0.5%.

In Patent Literature 6, it is attempted to obtain a good-quality nitride semiconductor device by minimizing the amount of oxygen which inevitably exists in an AlN buffer layer. In contrast, the inventors of the present invention have obtained a good-quality nitride semiconductor device by positively introducing oxygen to form AlNO buffer layer 2, and directly forming a nitride semiconductor layer on the surface thereof. Although the reason why a good result has been obtained by such a technique has not been confirmed, the result seems to be obtained for the following reasons.

Firstly, oxygen existing in the atmosphere inside chamber 21 during formation of AlNO buffer layer 2 has different properties. Namely, oxygen supplied from high-purity oxygen gas introduced into chamber 21 (high-purity oxygen) has properties different from those of oxygen generated by knocking out an oxygen-containing substance originally remaining in the inner wall of chamber 21 and the like during sputtering (residual oxygen). Residual oxygen is generally considered to be generated by decomposing moisture adsorbed onto a chamber inner wall, and is considered to be in the form of $H_2O$ itself, OH (neutral or ionic), or O (neutral or ionic). On the other hand, high-purity oxygen is considered to be in the form of $O_2$ itself, $O_2$ ion, or O (neutral or ionic). For example, since high-purity oxygen is contained in AlNO buffer layer 2 in the form of $O_2$, or contained in AlNO buffer layer 2 in the state not containing hydrogen, it is presumed that AlNO buffer layer 2 has properties different from those of an AlN film having residual oxygen mixed therein.

Secondly, in AlNO buffer layer 2 containing oxygen appropriately, it is considered that oxygen serves to fill a gap between columnar AlN crystals (grain boundary) forming AlNO buffer layer 2, and reduces the dislocation density of the nitride semiconductor layer directly formed thereon. Further, it is considered that high-purity oxygen satisfactorily serves to fill the grain boundary.

It is to be noted that, although the case where the nitrogen gas and the oxygen gas are supplied into chamber 21 has been described above, the present invention is not limited thereto. For example, at least a portion of the nitrogen gas may be replaced with argon gas, and thereby the state of plasma of the atmosphere gas generated during reactive sputtering can be adjusted.

Figure 9:
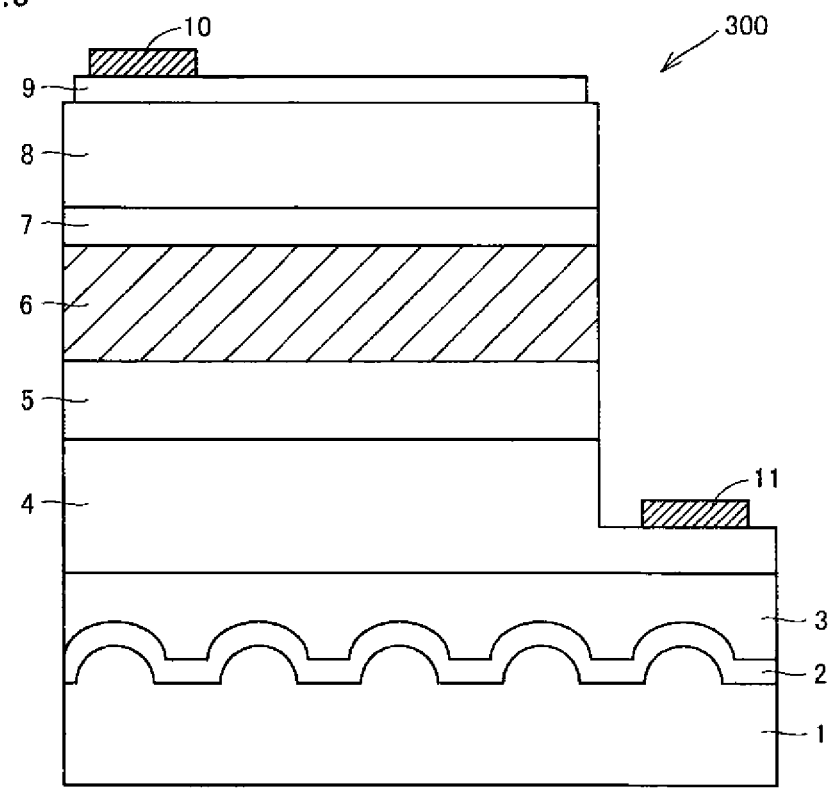
FIG. 9 is a schematic cross sectional view of a nitride semiconductor light-emitting diode device in Example 2.

FIG. 9 shows a schematic cross sectional view of a nitride semiconductor light-emitting diode device in Example 2. Here, a nitride semiconductor light-emitting diode device 300 in Example 2 includes sapphire substrate 1 having a surface processed to have convexes and concaves, AlNO buffer layer 2 placed in contact with a surface of sapphire substrate 1, nitride semiconductor underlying layer 3 placed in contact with a surface of AlNO buffer layer 2, n-type nitride semiconductor contact layer 4 placed in contact with a surface of nitride semiconductor underlying layer 3, n-type nitride semiconductor cladding layer 5 placed in contact with a surface of n-type nitride semiconductor contact layer 4, nitride semiconductor active layer 6 placed in contact with a surface of n-type nitride semiconductor cladding layer 5, p-type nitride semiconductor cladding layer 7 placed in contact with a surface of nitride semiconductor active layer 6, p-type nitride semiconductor contact layer 8 placed in contact with a surface of p-type nitride semiconductor cladding layer 7, and light-transmitting electrode layer 9 placed in contact with a surface of p-type nitride semiconductor contact layer 8. In addition, n-side electrode 11 is placed to be in contact with an exposed surface of n-type nitride semiconductor contact layer 4, and p-side electrode 10 is placed to be in contact with a surface of light-transmitting electrode layer 9.

Here, in sapphire substrate 1, convex and concave shapes are formed for the purpose of improving crystal quality of nitride semiconductor underlying layer 3 and scattering light at an interface. Preferably, the convex and concave shapes have a depth fully larger than the thickness of AlNO buffer layer 2. Further, since nitride semiconductor underlying layer 3 is also preferably formed along the convex and concave shapes, the convexes and concaves preferably have a depth of not less than 0.3 μm and not more than 3 μm. Furthermore, an interval between the convexes is preferably not less than 2 μm and not more than 5 μm. Although each convex may have a trapezoidal cross sectional shape, an upper portion of each convex may be rounded.

Hereinafter, an example of the semiconductor light-emitting diode device described in the embodiment will be described in detail. Firstly, sapphire substrate 1 shown in FIG. 9 was placed on heater 23 provided inside chamber 21 of the DC magnetron sputtering apparatus shown in FIG. 4 in which a voltage was applied using the DC-continuous mode.

Here, substrate 1 was placed such that the c-plane of sapphire substrate 1 faced the surface of Al target 26 and shortest distance d between the center of the surface of Al target 26 and the c-plane of sapphire substrate 1 was set to 180 mm. Thereafter, sapphire substrate 1 was heated to a temperature of 550° C. by heater 23. The pressure inside chamber 21 immediately before sputtering was not more than $3 \times 10^{-5}$ Pa.

Next, nitrogen gas and oxygen gas were supplied into chamber 21 of the DC magnetron sputtering apparatus at flow rates of 40 sccm and 0.02 sccm, respectively, and the pressure was kept at 0.4 Pa. Thereafter, the temperature of sapphire substrate 1 was maintained at 550° C.

Then, by reactive sputtering using the DC magnetron sputtering method performed by applying a bias voltage of 330 W between sapphire substrate 1 and Al target 26 by means of the DC-continuous mode to generate plasma, 30 nm-thick AlNO buffer layer 2 made of an aggregate of columnar crystals of aluminum oxynitride (AlON) was stacked on the c-plane of sapphire substrate 1, as shown in FIG. 9. The forming rate of AlNO buffer layer 2 on this occasion was 0.04 nm/second.

It is to be noted that magnet 27 in cathode 28 of the DC magnetron sputtering apparatus shown in FIG. 4 was oscillated both during nitridation of the c-plane of sapphire substrate 1 and during stacking of AlNO buffer layer 2. Further, stacking of AlNO buffer layer 2 was performed for a predetermined period of time in accordance with the film formation rate of AlNO buffer layer 2 measured beforehand, and nitrogen plasma was stopped when the thickness of AlNO buffer layer 2 reached 30 nm.

Next, sapphire substrate 1 having AlNO buffer layer 2 stacked thereon was taken out from chamber 21 of the DC magnetron sputtering apparatus, and was placed inside the reactor of the MOCVD apparatus. Here, sapphire substrate 1 having AlNO buffer layer 2 stacked thereon was placed on a graphite susceptor for heating by a high-frequency induction heater. It is to be noted that, when sapphire substrate 1 having AlNO buffer layer 2 stacked thereon is heated by a resistive heater, sapphire substrate 1 having AlNO buffer layer 2 stacked thereon is placed on a quartz tray placed on the graphite susceptor.

Thereafter, while ammonia gas as well as the nitrogen gas and the hydrogen gas as carrier gases were supplied into the reactor, the temperature of sapphire substrate 1 was raised to 1125° C. over about 15 minutes. Here, the pressure inside the reactor was set to normal pressure, and the flow rate ratio between the hydrogen gas and the nitrogen gas (the flow rate of the hydrogen gas/the flow rate of the nitrogen gas) serving as the carrier gases was set to 50/50. After it was confirmed that the temperature of sapphire substrate 1 became stable at 1125° C., supply of TMG gas into the reactor was started, and 4 μm-thick GaN underlying layer 3 made of undoped GaN was stacked on the surface of AlNO buffer layer 2 by the MOVPE method, as shown in FIG. 9. It is to be noted that the ammonia gas was supplied into the reactor such that a mole ratio of a group V element to a group III element (the number of moles of the group V element/the number of moles of the group III element) was set to 1500.

Next, with the temperature of sapphire substrate 1 being kept at 1125° C., silane gas was supplied into the reactor such that the doping concentration of Si was set to $1 \times 10^{19}/cm^3$. Thereby, 3 μm-thick Si-doped n-type GaN contact layer 4 was stacked on the surface of GaN underlying layer 3 by the MOVPE method, as shown in FIG. 9.

Subsequently, supply of the TMG gas and the hydrogen gas into the reactor was stopped, and thereafter the temperature of sapphire substrate 1 was lowered to 800° C. and the carrier gas was changed from the hydrogen gas to the nitrogen gas. Then, after it was confirmed that the state inside the reactor became stable, the TMG gas, TMI gas, and the ammonia gas as source gases were supplied into the reactor, and the silane gas was supplied into the reactor such that the doping concentration of Si was set to $1 \times 10^{18}/cm^3$. Thereby, 8 nm-thick Si-doped n-type $In_{0.99}Ga_{0.99}N$ cladding layer 5 was stacked on the surface of n-type GaN contact layer 4, as shown in FIG. 9.

Next, supply of the silane gas was stopped, and thereafter the TMG gas and the TMI gas were supplied. Thereby, a 3.5 nm-thick quantum well layer made of undoped $In_{0.15}Ga_{0.85}N$ was stacked on the surface of Si-doped n-type $In_{0.01}Ga_{0.99}N$ cladding layer 5. Subsequently, supply of the silane gas was started and supply of the TMI gas was stopped to stack a 6 nm-thick quantum barrier layer made of Si-doped n-type GaN.

By repeating a procedure for forming the quantum well layer and the quantum barrier layer as described above, MQW active layer 6 was stacked, which had a multiple quantum well structure including six quantum well layers made of undoped $In_{0.15}Ga_{0.85}N$ and six quantum barrier layers made of Si-doped n-type GaN alternately stacked one by one.

Next, the temperature of sapphire substrate 1 was raised to 1100° C., and the carrier gas was changed from the nitrogen gas to the hydrogen gas. Then, supply of the TMG gas, TMA gas, and $CP_2Mg$ gas into the reactor was started, and the supply was continued for two minutes. Thereafter, supply of the TMG gas and the TMA gas was stopped. Thereby, 20 nm-thick p-type $Al_{0.2}Ga_{0.8}N$ cladding layer 7 was stacked on the surface of MQW active layer 6.

Subsequently, the temperature of sapphire substrate 1 was kept at 1100° C., and supply of the TMA gas was stopped while the ammonia gas was supplied into the reactor. Thereafter, the amounts of supply of the TMG gas and the $CP_2Mg$ gas into the reactor were changed. Thereby, 0.2 μm-thick Mg-doped p-type GaN contact layer 8 was stacked on the surface of p-type $Al_{0.2}Ga_{0.8}N$ cladding layer 7, as shown in FIG. 9.

After p-type GaN contact layer 8 was stacked, power distribution to the heater was immediately stopped, and the carrier gas to be supplied into the reactor was changed from the hydrogen gas to the nitrogen gas. Then, after it was confirmed that the temperature of sapphire substrate 1 was lowered to 300° C. or less, sapphire substrate 1 having the above layers stacked thereon was taken out from the reactor.

Next, as shown in FIG. 9, ITO layer 9 was formed on the surface of p-type GaN contact layer 8, and thereafter a titanium layer, an aluminum layer, and a gold layer were stacked in this order on the surface of ITO layer 9. Thereby, p-side bonding pad electrode 10 was formed.

Next, as shown in FIG. 9, a portion of a stacked body having p-side bonding pad electrode 10 formed thereon was removed by dry etching to expose a portion of the surface of n-type GaN contact layer 4.

Thereafter, as shown in FIG. 9, a nickel layer, an aluminum layer, a titanium layer, and a gold layer were stacked in this order on the exposed surface of n-type GaN contact layer 4. Thereby, n-side bonding pad electrode 11 was formed.

Then, a back surface of sapphire substrate 1 was ground and polished to be a mirror-like surface, and thereafter sapphire substrate 1 was diced into square chips of 350 μm per side. Thereby, the nitride semiconductor light-emitting diode device in Example 2 was fabricated.

When a forward current of 20 mA was passed between p-side bonding pad electrode 10 and n-side bonding pad electrode 11 of the nitride semiconductor light-emitting diode device in Example 2 fabricated as described above, the forward current of 20 mA had a forward voltage of 3.0 V. It is to be noted that the forward voltage corresponds to the operation voltage of the nitride semiconductor light-emitting diode device. In addition, when light emission by the nitride semiconductor light-emitting diode device in Example 2 was observed through ITO layer 9, the light emission had a wavelength of 450 nm and an output of 23.4 mW.

It should be understood that the embodiment and examples disclosed herein are illustrative and non-restrictive in every respect. The scope of the present invention is defined by the scope of the claims, rather than the description above, and is intended to include any modifications within the scope and meaning equivalent to the scope of the claims.

The present invention has a possibility that it is suitably applicable to manufacturing of a nitride semiconductor device such as a nitride semiconductor light-emitting diode device, a nitride semiconductor laser device, and a nitride semiconductor transistor device, using a group III nitride semiconductor.

The invention claimed is:

1. A method for manufacturing a nitride semiconductor device, comprising the steps of:
   forming an AlNO buffer layer containing at least aluminum, nitrogen, and oxygen on a substrate; and
   forming a nitride semiconductor layer on said AlNO buffer layer,
   wherein, in the step of forming said AlNO buffer layer, said AlNO buffer layer is formed by a reactive sputtering method using aluminum as a target in an atmosphere to and from which nitrogen gas and oxygen gas are continuously introduced and exhausted, and
   said atmosphere is an atmosphere in which a ratio of a flow rate of said oxygen gas to a sum of a flow rate of said nitrogen gas and the flow rate of said oxygen gas is not more than 0.5%.

2. The method for manufacturing a nitride semiconductor device according to claim 1, wherein, in the step of forming said AlNO buffer layer, said AlNO buffer layer is formed to have an oxygen concentration of not less than 1 atomic % and not more than 10 atomic %.

3. The method for manufacturing a nitride semiconductor device according to claim 1, wherein, in the step of forming said AlNO buffer layer, said AlNO buffer layer is formed to have a uniform oxygen concentration throughout said AlNO buffer layer.

4. The method for manufacturing a nitride semiconductor device according to claim 1, wherein, in the step of forming said AlNO buffer layer, said AlNO buffer layer is formed to have a refractive index of not less than 2 and not more than 2.1 for light with a wavelength of 450 nm.

5. The method for manufacturing a nitride semiconductor device according to claim 1, wherein, in the step of forming said AlNO buffer layer, said AlNO buffer layer is formed to have a film thickness of not less than 5 nm and not more than 100 nm.

6. The method for manufacturing a nitride semiconductor device according to claim 1, wherein, in the step of forming said AlNO buffer layer, said AlNO buffer layer is formed to cover not less than 90% of a surface of said substrate.

7. The method for manufacturing a nitride semiconductor device according to claim 1, wherein, in the step of forming said AlNO buffer layer, said AlNO buffer layer is formed with said substrate having a temperature of not less than 300° C. and not more than 1000° C.

8. The method for manufacturing a nitride semiconductor device according to claim 1, wherein, in the step of forming said AlNO buffer layer, the atmosphere immediately before formation of said AlNO buffer layer has a pressure of not more than $1 \times 10^{-4}$ Pa.

9. The method for manufacturing a nitride semiconductor device according to claim 1, further comprising the step of performing dummy discharge within a chamber of a sputtering apparatus, before the step of forming said AlNO buffer layer.

10. The method for manufacturing a nitride semiconductor device according to claim 1, wherein, in the step of forming said AlNO buffer layer, said AlNO buffer layer is formed under a pressure of the atmosphere of not less than 0.2 Pa.

11. The method for manufacturing a nitride semiconductor device according to claim 1, wherein, in the step of forming said AlNO buffer layer, said AlNO buffer layer is formed at a formation rate of not less than 0.01 nm/second and not more than 1 nm/second.

12. The method for manufacturing a nitride semiconductor device according to claim 1, wherein
   said substrate includes a sapphire substrate, and
   said nitride semiconductor layer includes an n-type nitride semiconductor layer, a nitride semiconductor active layer, and a p-type nitride semiconductor layer.

13. The method for manufacturing a nitride semiconductor device according to claim 1, wherein, in the step of forming said AlNO buffer layer, said reactive sputtering method is performed by a DC magnetron sputtering method performed by applying a voltage between said substrate and said target arranged to have a distance of not less than 100 mm and not more than 250 mm therebetween, using a DC-continuous mode.

14. The method for manufacturing a nitride semiconductor device according to claim 1, wherein, in the step of forming said AlNO buffer layer, said target is arranged to be inclined with respect to a surface of said substrate.

15. A nitride semiconductor light-emitting device manufactured by a method for manufacturing a nitride semiconductor device as recited in claim 1.

16. A light-emitting apparatus, including a nitride semiconductor light-emitting device as recited in claim 15.

* * * * *